US006216937B1

(12) United States Patent
DeLaurentis et al.

(10) Patent No.: US 6,216,937 B1
(45) Date of Patent: Apr. 17, 2001

(54) PROCESS AND APPARATUS TO REMOVE CLOSELY SPACED CHIPS ON A MULTI-CHIP MODULE

(75) Inventors: Stephen A. DeLaurentis, Claverack; Mario J. Interrante, New Paltz; Raymond A. Jackson, Fishkill; John U. Knickerbocker, Hopewell Junction; Sudipta K. Ray, Wappingers Falls; Kathleen A. Stalter, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/470,455

(22) Filed: Dec. 22, 1999

(51) Int. Cl.[7] .............................. B23K 1/00; B23K 1/018
(52) U.S. Cl. ........................ 228/13; 228/264; 228/19 K
(58) Field of Search .................................. 228/264, 119, 228/13, 19, 20.1, 44.7, 49.1, 49.5

(56) References Cited

U.S. PATENT DOCUMENTS

| | | | |
|---|---|---|---|
| 5,065,933 | * 11/1991 | Basavanhally | 228/102 |
| 5,172,469 | * 12/1992 | Onda et al. | 29/762 |
| 5,669,545 | * 9/1997 | Pham et al. | 228/1.1 |
| 5,671,530 | * 9/1997 | Combs et al. | 29/834 |
| 5,751,553 | * 5/1998 | Clayton | 361/749 |
| 5,770,891 | * 6/1998 | Frankeny et al. | 257/727 |
| 5,779,133 | * 7/1998 | Jackson et al. | 228/13 |
| 5,782,403 | * 7/1998 | Wang | 228/264 |
| 5,862,588 | * 1/1999 | Heim et al. | 29/840 |
| 6,054,008 | * 4/2000 | Chan et al. | 156/247 |

FOREIGN PATENT DOCUMENTS

11045906A * 2/1999 (JP).

OTHER PUBLICATIONS

IBM Technical Disclosure Bulletin (NN8904214), Apr. 1, 1989.*

* cited by examiner

Primary Examiner—Clifford C. Shaw
Assistant Examiner—Kiley Stoner
(74) Attorney, Agent, or Firm—Aziz M. Ahsan; Edward W. Brown

(57) ABSTRACT

A process and apparatus for removing flip chips with C4 joints mounted on a multi-chip module by applying a tensile force to one or more removal member bonded to the back of one or more flip chips during heating of the module to a temperature sufficient to cause the C4 joints to become molten. The tensile force can either be a compressed spring, or a bimetallic member which is flat at room temperature and becomes curved when heated to such temperature, or a memory alloy whose original shape is curved and which is bent flat at room temperature but returns to its original curved shape when heated to such temperature. An adhesive is used to bond the removal member to the chip to be removed and is a low temperature, fast curing adhesive with high temperature tolerance after curing.

12 Claims, 3 Drawing Sheets

PROCESS AND APPARATUS TO REMOVE CLOSELY SPACED CHIPS ON A MULTI-CHIP MODULE

BACKGROUND OF THE INVENTION

1. Field of the Invention

The present invention relates generally to the repair of multi-chip modules and, more particularly, to a process and apparatus for removing one or more chips from a multi-chip module in which the chips are so closely mounted to each other on the module the chips are described as being brickwalled.

2. Description of the Prior Art

To increase the number of flip chips being C4 joined to a multi-chip module and thus increase the density without increasing the physical size of the module, the chip are being placed so close together that the sides of the chips are nearly touching each other. The removal of one or more chips is required due a defective chip or C4 joint, discovered during testing, or to upgrade the module function by replacing one or more of the mounted chips with one or more higher performing chips. One present method and apparatus for removing chips from a module employ gripping clips which are used in conjunction with a bi-metallic disc. One of the clips physically contacts one side of a chip to be removed and the other clip contacts the opposite side of the chip. When the module is heated to a temperature to cause the C4 joints to become molten, a bimetallic disc provides an upward tensile force on the gripping clips to remove the gripped chip from the module. Examples of chip removal by gripping the opposite sides of a chip is found in U.S. Pat. Nos. 4,485,958, 5,553,766 and 5,779,133, and IBM TDB Vol 18, No 9, February 1976, pp 2850.

However, because of the physical size of the gripping clips, a minimum spacing of 2 mm is required between chips in order to remove a chip with such gripping clips. This minimum spacing requirement wastes space on the top surface of the module and prevents closely spaced mounting of chips previously described as brickwalling.

Other processes and apparatuses for removing flip chips from a module without gripping the opposite sides of a chip are hot vacuum as described in U.S. Pat. No. 5,605,277 and hot gas as disclosed in U.S. Pat. No. 5,598,965. Neither of these processes and apparatus are suitable for brickwall mounted chips because of a large spacing is required between chips so that the chip to be removed can be isolated from the other chips.

For removing non-flip chips or chips without C4 joints in which the back of the chips are mounted to the module, a process and apparatus is described in U.S. Pat. No. 5,154,793 which permits brickwall mounting but, because this process and apparatus is used for removing back bonded non-flip chips, the temperature required is not sufficient high to melt C4 joints for the removal of flip chips in the temperature range of about 340 to about 375° C.

Consequently, there is a need for a flip chip removal process and apparatus which is able to remove chips from brickwall mounted chips without damaging the removed chips or chips adjacent to the removed chips. Therefore, it is an object of the present invention to provide a low cost, highly reliable process and apparatus which does not require grippers to remove the flip chips and which permit minimal spacing between chips to achieve brickwalling. A further object of the present invention is to provide a process and apparatus which pulls the flip chip from the back surface of the chip thereby not requiring any spacing between the chips. A final object of the present invention is provide a process and apparatus in which the conventional furnace for C4 joining can be used for removing selected flip chips while simultaneously joining additional chips on other locations of the multi-chip module.

SUMMARY OF THE INVENTION

To achieve the foregoing objects, the present invention comprises the process of bonding a removal member, of a dimension smaller than the area of the chip, to the exposed back of the chip with a low temperature curable thermal adhesive which, when cured is able to withstand the high temperatures capable of melting the C4 joints. A tensile force is applied to the removal member which is greater than the surface tension of molten C4 joints of the chip or chips to be removed. The multi-chip module is then heated in an ambient controlled furnace to a temperature to melt the C4 joints. The tensile force necessary will vary depending upon the number of C4 joints. The larger the number of C4 joints, the greater the tensile force required to overcome the surface tension of the C4 joints. Due the tensile force applied, either before or during the heating of the module, to the removal member on the backs of the chip or chips to be removed, the chip or chips will be lifted from the module when the C4 joints become molten. After cooling, the lifted chip or chips are removed from the module while the C4 joints of the remaining chips are solidified to the pads on the module.

Another aspect of the present invention is an apparatus for removing brickwalled chips comprising a removing assembly including a removal member, bonding means for attaching the removal member to the back of a chip, and tension means to apply a minimal tensile force to the removal member and the back of the chip to be removed either prior to heating the module to a temperature to melt the C4 joints or, alternatively, during such heating.

A further aspect of the present invention is the process of removing a chip from a multi-chip module comprising the steps of bonding one end of a removal member to the back of the chip to be removed, followed by applying a tension force to the other end of the removal member, before or during heating of the module to a temperature to cause the C4 joints to melt, which is greater than the surface tension of melted C4 joints; and then heating the module to that melting temperature to separate the chip to be removed from the module.

BRIEF DESCRIPTION OF THE DRAWINGS

The above summary of the invention and other objects and features of the present invention will become apparent from the following description of preferred embodiments given in conjunction with the accompanying drawings, in which.

DETAILED DESCRIPTION

A flip chip is one in which is the chip face, with the contacts of the circuit, is mounted face down. The contacts are formed of a lead/tin alloy which, when melted, will reflow and maintain its location on the chip and are commonly know as Controlled Collapse Chip Connection (C4) joints. When attaching flip chips to a module, the chips are positioned on pads on the module and the module carrying the chips are passed through a furnace at a temperature sufficient to melt the lead/tin alloy of each C4 joint and reflow it to the respective pads on the module. Upon cooling the chips will be physically and electrically connected to the module. Because the flip chips with C4 joints permit area connection, or contacts across the face area of the chip, to the module, the chips can be spaced so closely together on the module that they resemble a brickwall or less than 0.4 mm spacing between chips.

Figure 1:
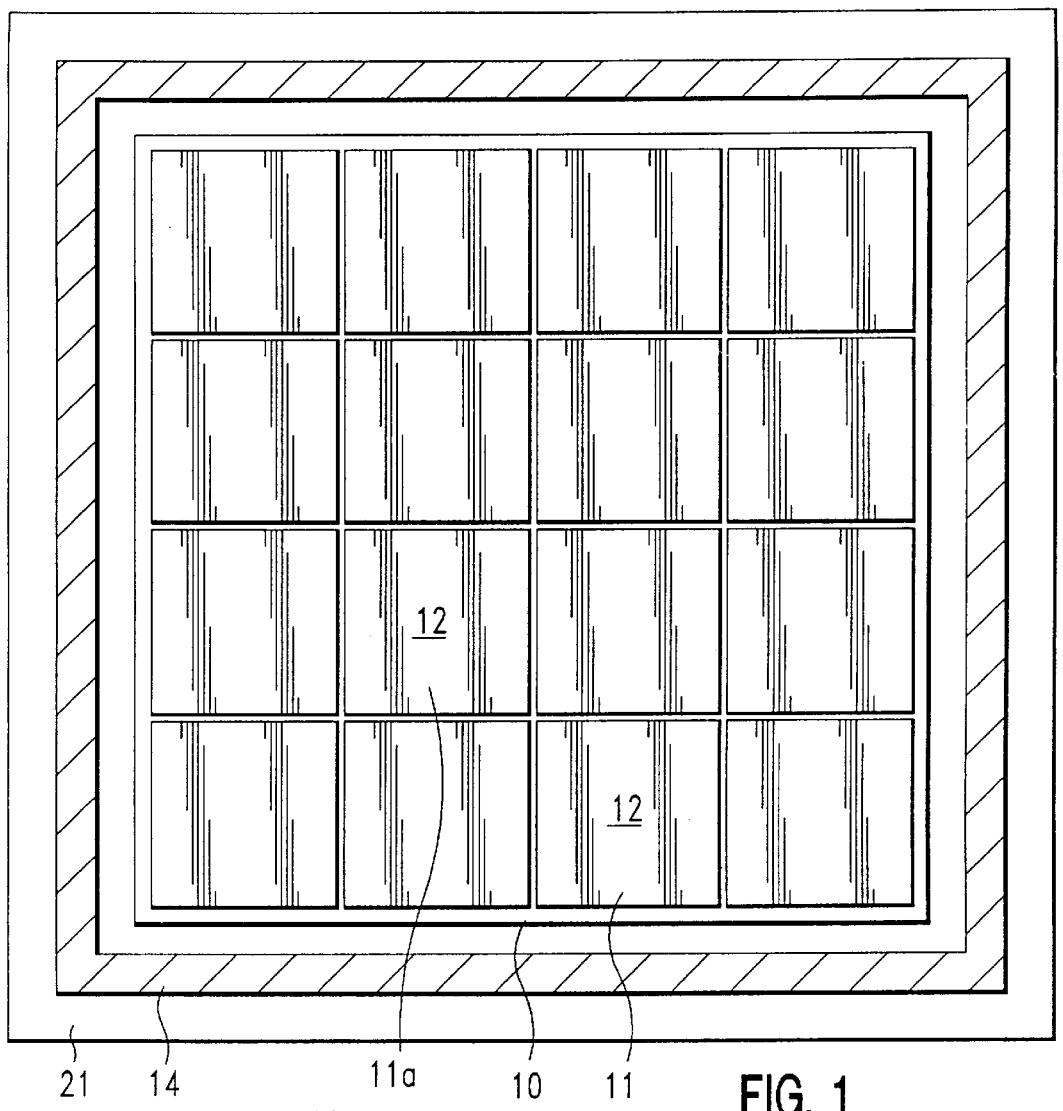
FIG. 1 is a plan view of a multi-chip module with flip chips mounted on the module in brickwall fashion with one identified for removal.
Figure 2:
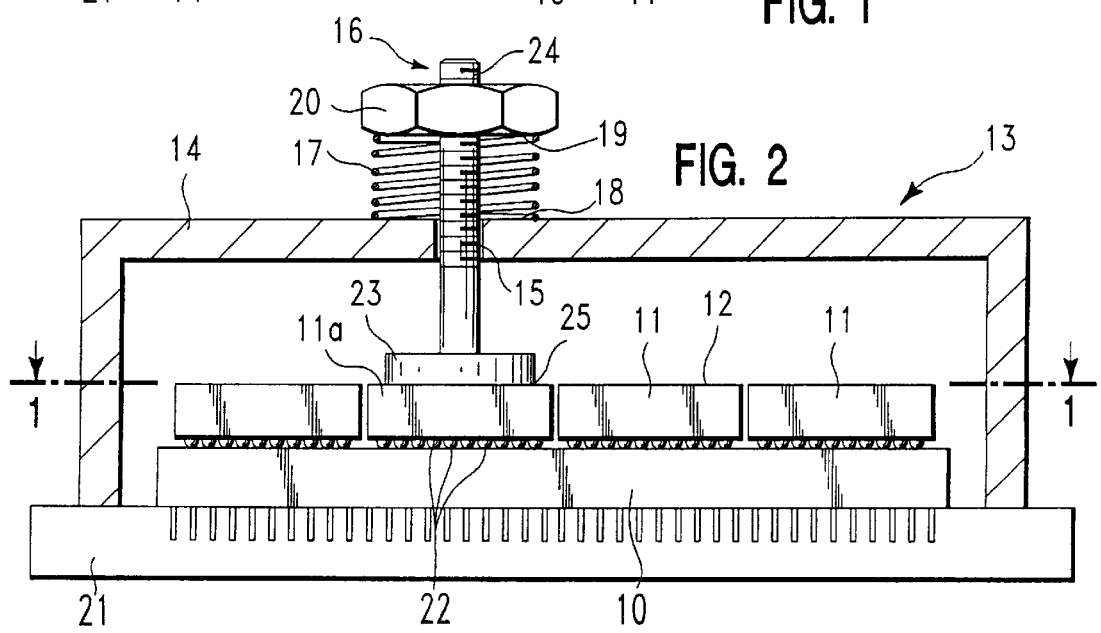
FIG. 2 is a cross sectional view of the multi-chip module of FIG. 1 positioned with the preferred flip chip removal assembly of the present invention with a tension spring and on a fixture used for carrying the module and removal assembly through the furnace to melt or reflow the C4 joints.

With this general background, the present invention will now be described in conjunction with the drawings. Turning to FIG. 1, the top of a multi-chip module 10 is shown with closely spaced or brickwalled flip chips 11 across the upper surface of the module. The back 12 of the chips are shown because the chips are flipped or mounted face down and the C4 joints are not shown. Chip 11a has been identified as one to be removed. In FIG. 2, the preferred embodiment of the flip chip removal assembly 13 of the present invention is shown with a housing or tension mount 14 with one or more access holes 15. A removal member 16, smaller in dimension than the area of the chip, extends through one of the holes and is in contact with the back 12 of the chip to be removed 11a. A tension spring 17 is positioned around the member 16 with one end 18 in contact with the top of the housing or tension mount 14 and the other end 19 in contact with an adjustable tension element 20 for compressing the spring 17. The tension mount 14, compressed spring 17 and tension element 20 comprise tension means for applying a tensile force to the removal member 16. During removal of the chip 11a, the multi-chip module is mounted on a fixture 21 for carrying the module through a heating means or furnace (not shown) to reflow C4 joints 22 of the chips 11. The tension mount 14 rests on the outer edges of the fixture 21.

Preferably, the removal member 16 comprises two pieces; one is relatively flat block or disc 23 and the other is a threaded stud 24 which is threaded into the block or disc 23 and on which is threaded the tension element 20 or herein, a nut. The block or disc 23 is smaller in dimension than the area of the back 12 of the chip. In the present instant, the block or disc 23 is 1–2 mm smaller in each dimension of the chip.

In accordance with one aspect of the present invention, the block or disc 23 is bonded to back 12 of the chip 11a to be removed with an bonding means or a low temperature curable adhesive 25. Herein, the cure temperature is in the range of about 100 to about 160° C. and, so as to not impact throughput in manufacturing, the cure time should be as short as possible and normally should not exceed 15 minutes. Because the adhesive must withstand the temperature of the reflow furnace after it has cured, the adhesive must retain bonding between the chip and the block or disc 23 at temperatures as high as about 375° C. because the reflow furnace operates in a temperature range of about 340 to about 375° C. to reflow the C4 joints of the chips 11. The adhesive 25 can be a commercially available epoxy adhesive which cures in 15 minutes or less at temperature in the range of 100 to 160° C. and which will retain it adhesion, after curing, at temperatures as high as about 375° C.

Figure 3:
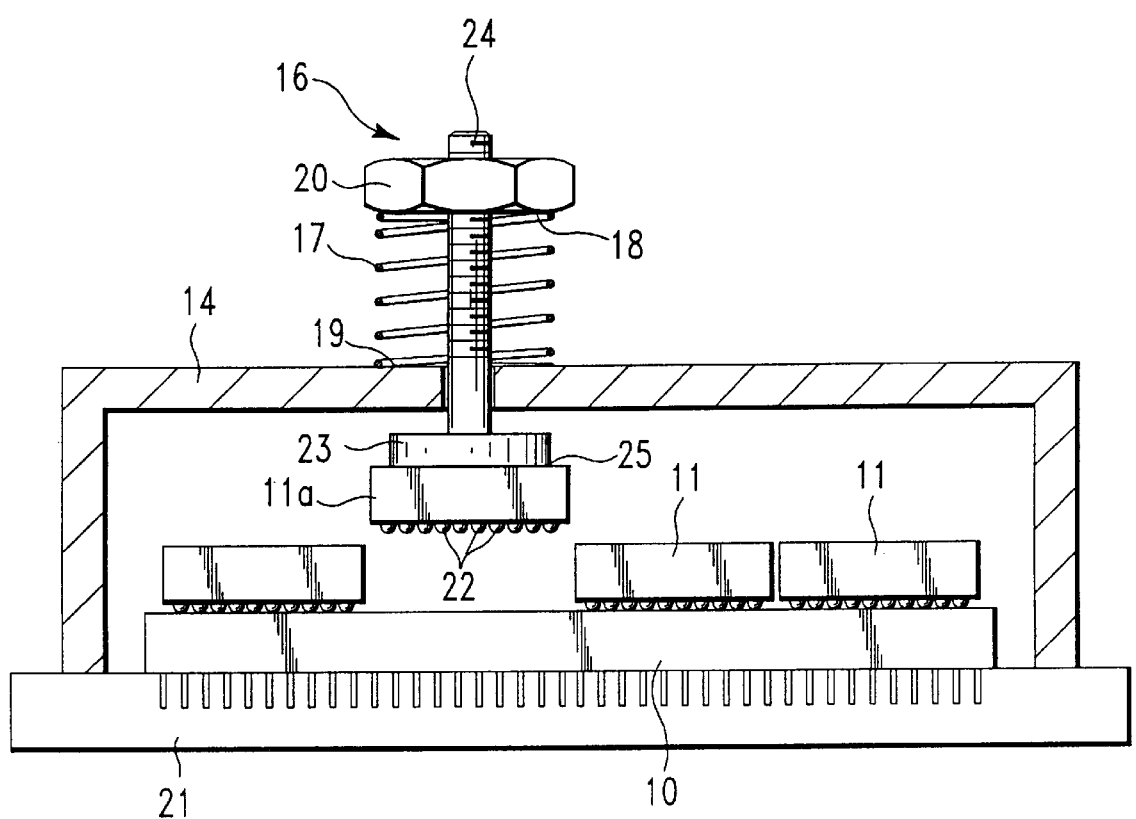
FIG. 3 is a cross sectional view of the multi-chip module with the preferred removal assembly after passing through the furnace and cooling of the C4 joints and showing the chip to be removed lifted off of the module.

In operation, the tension on the spring 16 is determined empirically by threading the element 20 down to compress the spring and then passing the module 10 on the fixture 21 through the furnace a sufficient number of times to identify the compression point on the spring and the position of the element 20 on the threaded stud 24. This compression point is when the tension of the spring is adequate to overcome the surface tension of C4 joints 22 of the chip a to be removed. This surface tension varies depending upon the number of C4 joints on the chip. As shown in FIG. 3, the module 10 on the reflow fixture 21 has been passed through the furnace after the compression point has been determined and the chip a has been removed from the module 10 while the other chips 11 remain fixed to the module.

After the fixture 21 has been removed from the furnace, the housing or tension mount 14 is separated from the module 10 on the fixture taking with it the removed chip a. Using an organic solvent for the adhesive, such as heated xylene or parachloroethylene at a temperature in the range of about 80 to about 100° C., the adhesive 23 is dissolved sufficiently to detach the chip a from the block or disc 23. The removal apparatus 13 is now ready to remove a chip from another module. In addition, the C4 joints of the removed chip, if operable, can be reworked and the chip reused. Although FIGS. 2 and 3 and the accompanying description only shows and narrates the removal of one chip, it will be understood that a number of chips can be removed at one time with the removal assembly 13. It would require additional holes 15 in the housing or tension mount 14 aligned with the chips to be removed and additional members 16 adhesively attached to the chips to be removed, springs 17 and tension elements 20, With this setup, a plurality of chips can be removed during one pass through the furnace. It should be understood that, although the multi-chip module 10 depicted in FIG. 1 shows all of chips centerlines lined up, the housing or tension mount 14 could be modified to so that any or all chips could be removed even though the centerlines do not line up. Further, it should be understood although not shown in the drawings that a chip or chips can be added to the same multi-chip module during the removal of one or more chips during one pass through the furnace.

Figure 4:
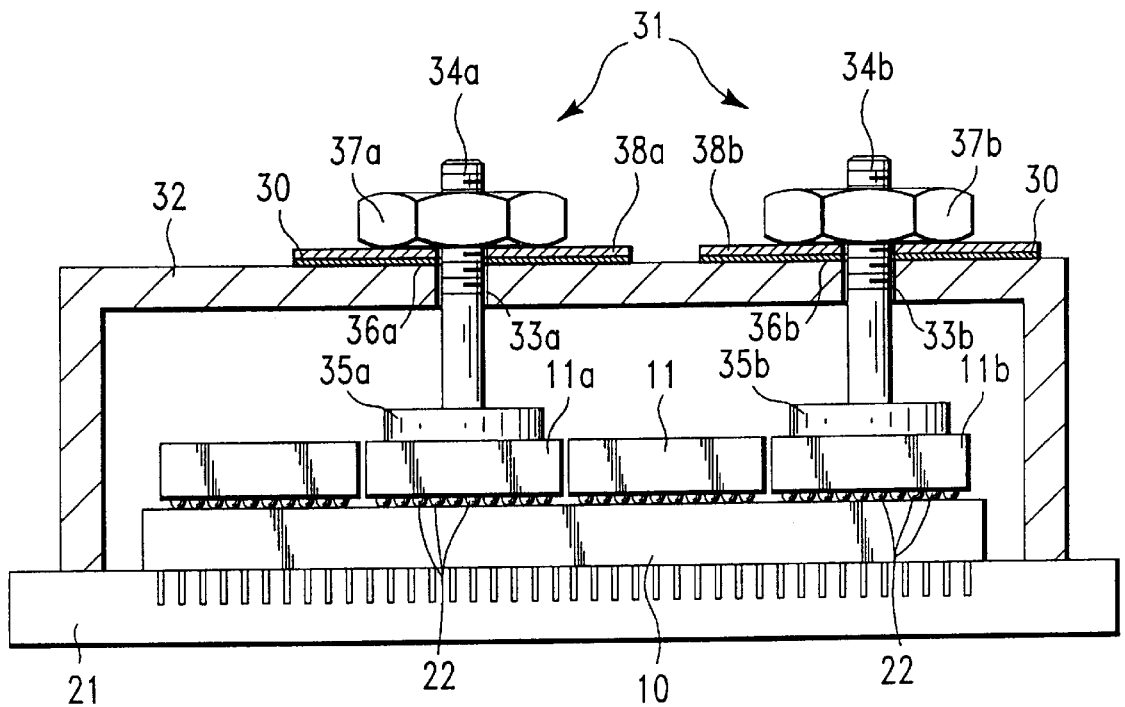
FIG. 4 is a cross sectional view of the multi-chip module of FIG. 1 positioned with a pair of alternative flip chip removal assemblies of the present invention with bi-metallic discs or memory alloy discs and on a fixture used for the carrying the module and a pair of removal assemblies through the furnace to melt or reflow the C4 joints.
Figure 5:
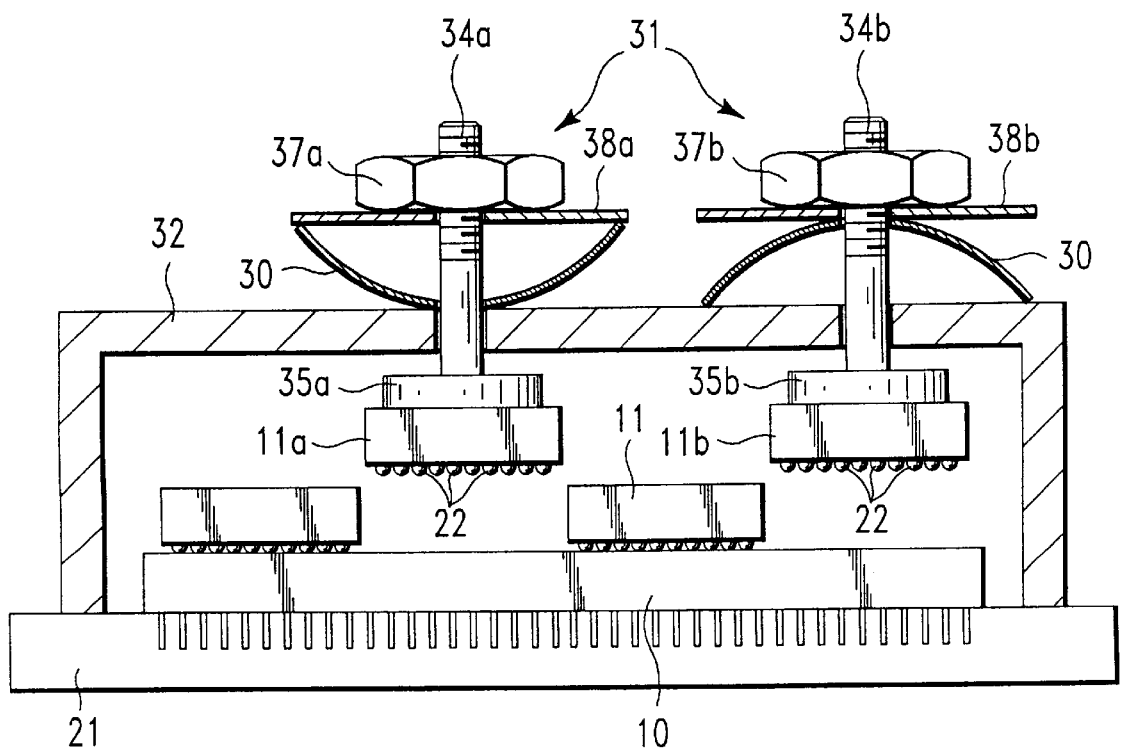
FIG. 5 is a cross sectional view of the multi-chip module with the pair of alterative removal assemblies after passing through the furnace showing the chips to be removed lifted off of the module.

An alternative embodiment of the present invention is show in FIGS. 4 and 5 in which the spring 17 of removal assembly 13 (FIGS. 2 and 3) is replaced with a layered bimetallic element 30 in which the layers have different thermal expansion coefficients. In this embodiment, two flip chips are to be removed from a module as shown in FIGS. 4 and 5. As shown in FIG. 4, removal assemblies 31 comprises a housing or tension mount 32 containing one or more holes 33a and 33b in its top portion and aligned with one or more chips 11a and 11b to be removed. Removal members 34a and 34b extend through the holes aligned with the chips to be removed and their lower ends 35a and 35b are adhesively bonded to chips and their upper ends 36a and 36b are rotatable attached to tension elements 37a and 37b. Positioned between the tension elements 37a and 37b and the housing or tension mount 32 are the layered bimetallic elements 30a and 30b in the form of a disc. The discs 30a and 30b are relatively flat at room temperature, as shown in FIG. 4, but become curved shapes during and immediately after leaving the reflow furnace (not shown as shown in FIG. 5). If necessary, washers 38a and 38b can be used to extend the diameter of the tension elements 37a and 37b. Depending on which side the layered bimetallic elements 30a and 30b are positioned, the curvature of the element, when heated, either will be concave, as shown by element 30a in FIG. 5 or convex as shown by element 30b in FIG. 5. The particular layered bimetallic element 30 selected is based on the known curved shape the element 30 takes on at specific temperatures. The selected element 30 is one whose temperature coincides with the melting temperature of the C4 joints 22 of the chips 11 and is in the range of about 340 to about 375° C.

Alternatively, a shaped memory alloy of nickel-titanium alloy can be used in place of the bimetallic element 30. The memory alloy can be bent from its original shape into a different shape and, upon heating, it will return to its original shape. In replacing the bimetallic element 30 with the memory alloy, the original shape of the memory alloy is curved and is bent into a flat configuration as shown in FIG. 4. When the removal assembly passes through the reflow furnace, the memory alloys, in place of the bimetallic elements 30a and 30b, will return to their original curved shapes and a cause a tensile force on each of the removal members to separate the chip 11a and 11b from the module in the same manner as shown in FIG. 5. The particular memory alloy is selected based upon the temperature at which the memory alloy returns to its original curved shape and is a temperature is in the range of about 340 to about 375° C. or one coinciding with the melting of the C4 joints 22. Again, depending on which side the flat memory alloy is positioned, the curvature of the heated memory alloy will be either concave or convex as shown in FIG. 5.

In operation, the general process of the chip removal of the present invention comprises the steps of: 1) bonding a removal member to a chip to be removed on a multi-chip module positioned on a reflow fixture; 2) placing a tension mount having holes aligned with the chips on the module on the reflow fixture; 3) extending the removal member through the hole in the tension mount aligned with the chip to be removed; 4) positioning a tension member, capable of applying a tensile force greater than the surface tension of the melted C4 joints of the chip, over the removal member and in contact with top of the tension mount; 15) attaching an adjustable tension element to the free end of the removal member and in contact with the tension member; and 5) passing the reflow fixture carrying the module and removal apparatus through a furnace to melt the C4 joints of the chips on the module and to cause the tension force of the tension member on the removal member to separate the chip to be removed from the module. A more detailed aspect of the process of the present invention is where the tensile force is the result of either a compressed spring or the heating of a flat bi-metallic element or a flat memory alloy Although this invention has been described relative to particular embodiments, it will be apparent to those skilled in the art that various changes and modification may be made without departing from the spirit and scope of the invention as defined in the following claims.

Having thus described the invention, what is claimed is:

1. Apparatus for removing at least one flip chip of a plurality of closely spaced flip chips having C4 joints on their faces connected to pads on a multi-chip module comprising:

a selective flip chip removal assembly including a chip removal member and a tension mount having a top and four sides surrounding said multi-chip module and having at least one hole in its top aligned with a chip to be removed, said removal member comprising a block of a dimension smaller than an area of the back of the chip and a threaded stud fastened to the block at one end and to an adjustable tension element at the other end and extending through the hole in the top of a tension mount;

bonding means for adhesively attaching said block to the back of the chip to be removed;

tension means disposed around said stud and between the top of the tension mount and the tension element for applying a tensile force to said removing member greater than the surface tension of C4 joints while in a molten state; and heating means for heating the C4 joints to a temperature to place the C4 joints in a molten state, whereby the tension means causes the removing member to lift and separate the chip to be removed from the multi-chip module.

2. The apparatus of claim 1 wherein the multi-chip module is mounted on a reflow furnace fixture and the tension mount is a box-like structure with its four sides positioned at and on the outer edges of said fixture.

3. Apparatus for removing at least one flip chip of a plurality of closely spaced flip chips having backs and C4 joints on their faces connected to pads on a multi-chip module having a top containing pads and a periphery free of pads comprising:

a flip chip removal assembly including a removal mount disposed on the top and around the periphery of said module and a chip removal member slidable disposed in said removal mount and having an adjustable tension element;

bonding means for attaching said removal member to the back of the chip to be removed, tension means disposed between said removal mount and said tension element for applying a tensile force to said removal member greater than the surface tension of the C4 joints while in a molten state; and heating means for heating the C4 joints to a temperature to place the C4 joints in a molten state, whereby the tension means causes the removal member to lift and separate the chip to be removed from the multi-chip module.

4. The apparatus of claim 3 wherein said heating means is separate from the chip removal member.

5. The apparatus of claim 3 wherein the multi-chip module contains at least one chip with C4 joints not connected to pads on the module and said chip removal assemble is associated with a connected chip on the module to be removed, whereby the unconnected chip is connected to the pads on the module and said connected chip is removed after the heating means places the C4 joints of the unconnected and connected chips in a molten state.

6. The apparatus of claim 3 wherein the tension means is a compressed spring acting on the removal member and the chip to be removed and is decompressed when the surface tension of the C4 joints is overcome during heating to coact with the removal member to lift said chip off of the multi-chip module.

7. The apparatus of claim 3 wherein the tension means is a flat layered bimetallic element acting on the removal member and the chip to be removed and is deformed into a curved shape during heating to coact with the removal member to lift said chip off of the multi-chip module when the extent of the curved shape exceeds the surface tension of the C4 joints.

8. The apparatus of claim 3 wherein the tension means is a flattened memory alloy element, whose memory shape is curved, acting on the removing member and the chip to be removed and returns to its curved memory shape during heating to coact with the removing member to lift said chip off of the multi-chip module when the extent of the curved shape exceeds the surface tension of the C4 joints.

9. The apparatus of claim 3 wherein the bonding means for attaching the removing member to the chip to be removed is a low temperature, fast curing adhesive with high temperature tolerance after curing.

10. The apparatus of claim 9 wherein the adhesive cures in a temperatures range of about 100 to about 160° C. in less than 15 minutes and can tolerate temperature as high as about 375° C.

11. Apparatus for removing at least one flip chip of a plurality of closely spaced flip chips having backs and C4 joints on their faces connected to pads on a multi-chip module comprising:

a flip chip removal assembly including a tension mount having a top with at least one hole aligned with a chip to be removed, an adjustable tension element and a chip removal member, said removal member comprising a block of a dimension smaller than the area of the back of the chip and a threaded stud fastened to the block at one end and to the tension element at the other end and extending through the hole in the top of the tension mount;

bonding means for attaching the block of said removal member to the back of the chip to be removed;

tension means for applying a tensile force by said tension element to said removal member greater than the surface tension of the C4 joints while in a molten state; and heating means for heating the C4 joints to a temperature to place the C4 joints in a molten state, whereby the tension means causes the removal member to lift and separate the chip to be removed from the multi-chip module.

12. The apparatus of claim 11 wherein said tension mount surrounds the multi-chip module and is positioned on the outer edges of a heating fixture along with the module, the tension mount serving as a base for said tension means, and the fixture carrying the module and removal assembly thus disposed around the stud and between the top of the tension mount and the tension element.

* * * * *